United States Patent [19]

Ley

[11] 4,301,404
[45] Nov. 17, 1981

[54] METHODS AND APPARATUS FOR ANALYZING PERIODIC WAVEFORMS

[75] Inventor: Anthony J. Ley, Bievres, France

[73] Assignee: Solartron Electronic Group Limited, Farnborough, England

[21] Appl. No.: 119,070

[22] Filed: Feb. 6, 1980

[30] Foreign Application Priority Data

Feb. 9, 1979 [FR] France ................................ 79 03358

[51] Int. Cl.$^3$ ............................................. G01R 23/16
[52] U.S. Cl. .................................... 324/77 B; 364/484
[58] Field of Search ........................... 324/77 R, 77 B; 364/484; 235/150.3, 151.31

[56] References Cited

U.S. PATENT DOCUMENTS 3,778,606  12/1973  Schmitt ........................... 324/77 B

OTHER PUBLICATIONS

B. S. Perlman and V. H. Auerbach, "Phase-Locking Technique for Estimating the Ensemble Average of Time Series Data", *IEEE Transactions on Acoustics, Speech, and Signal Processing*, vol. ASSP-25, No. 4, Aug. 1977, pp. 295-299.

Primary Examiner—Michael J. Tokar
Attorney, Agent, or Firm—Joseph J. Kaliko; Mikio Ishimaru; Dale Gaudier

[57] ABSTRACT

A waveform to be analyzed is repetitively sampled at corresponding instants in each of several cycles, and the samples from each cycle for a respective instant summed to derive an average value for that instant in one cycle of the waveform. The average values are then used for Fourier transform analysis, either by mathematical manipulation or by sequential correlation. The timing of the samples is determined by counting pulses from a high-frequency clock for one cycle of the waveform, truncating the count to remove the n least significant digits, and taking a sample every time a number of pulses equal to the truncated count has occurred (resulting in $2^n$ samples per cycle for a modulo 2 counter).

4 Claims, 2 Drawing Figures

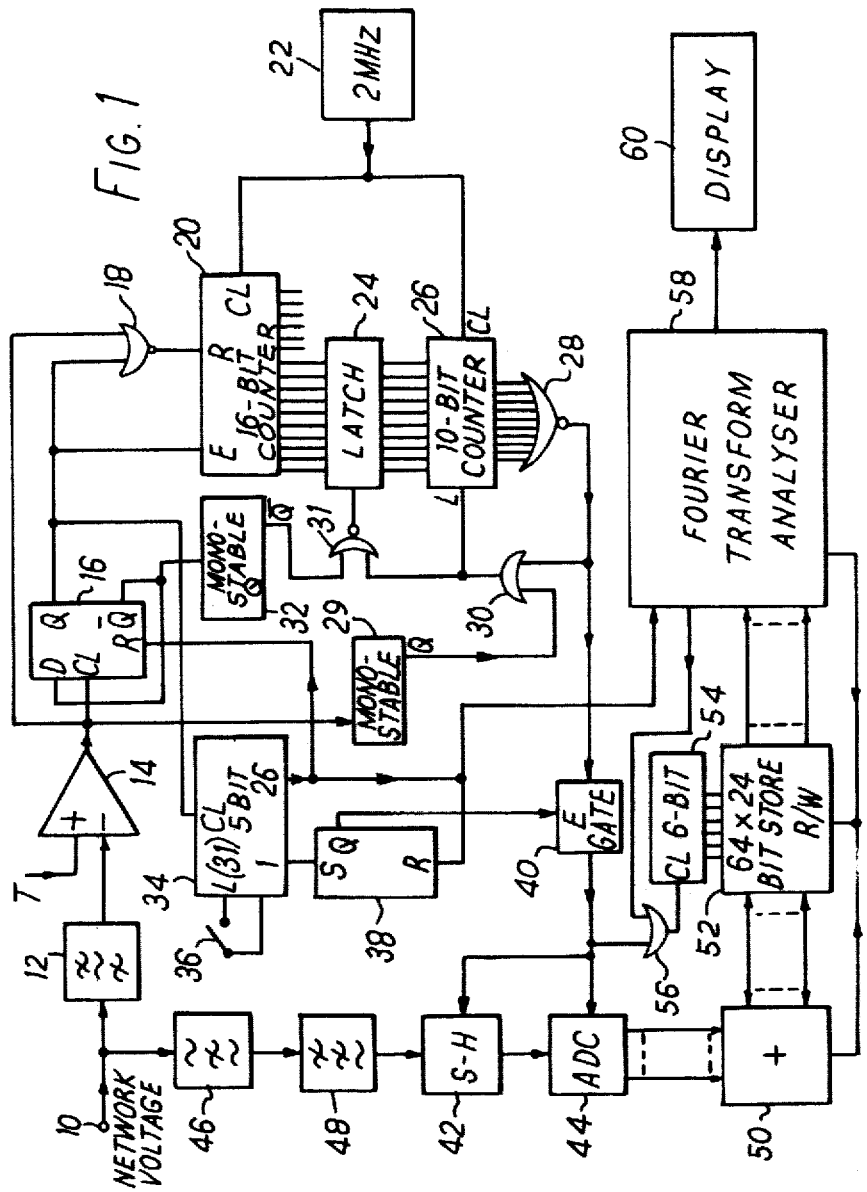

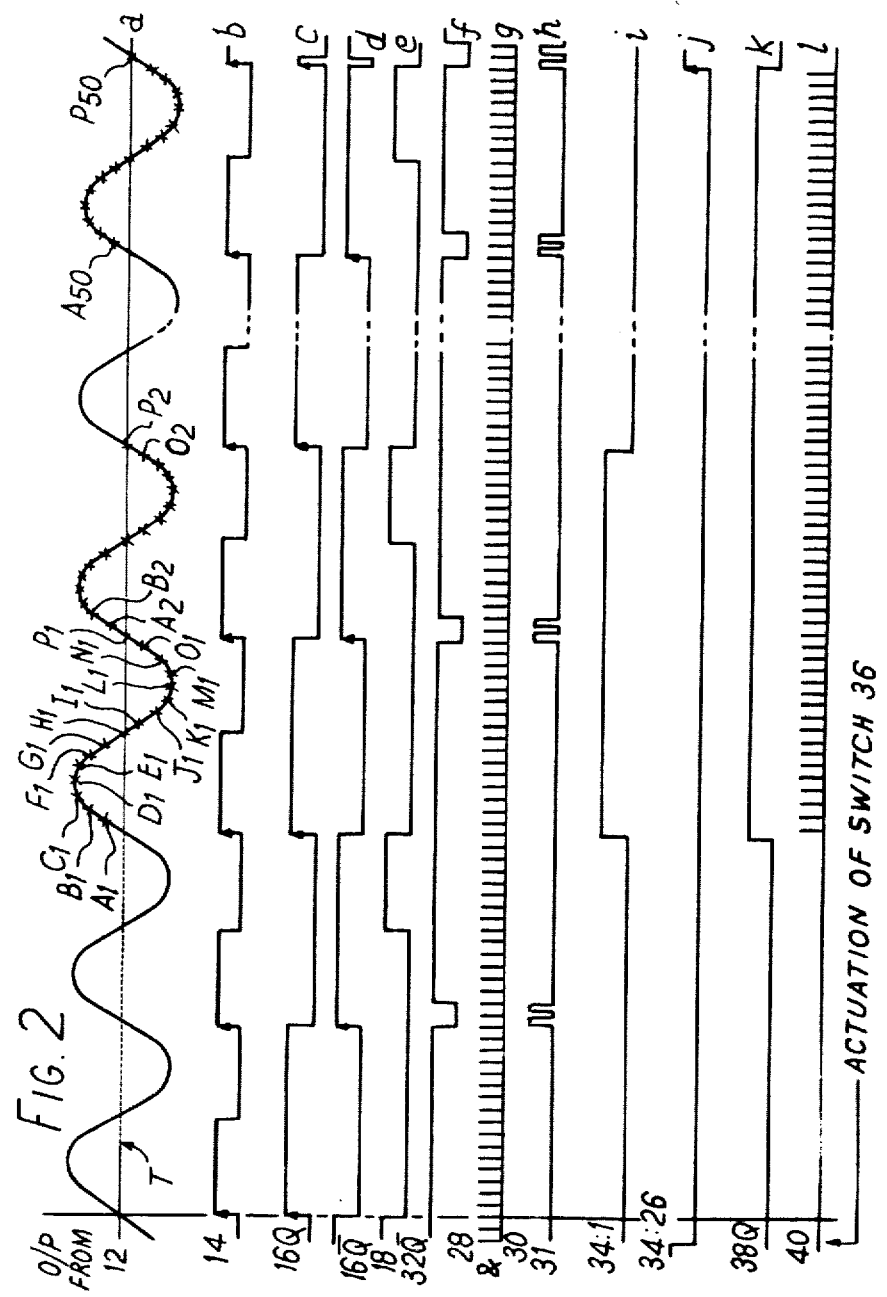

METHODS AND APPARATUS FOR ANALYZING PERIODIC WAVEFORMS

This invention relates to methods and apparatus for analysing periodic waveforms, and particularly, though not exclusively, to methods and apparatus for determining the harmonic content of, for example, the power supply waveform in an electric-power distribution network.

Known harmonic analysers involve heterodyne filters in which a variable frequency oscillator is adjusted to generate with each harmonic in turn a heterodyne signal at the frequency of a narrow bandpass filter. Thus the amplitude and phase of each harmonic can be determined by successive measurements of the output signal of the bandpass filter. This technique is slow, since the individual harmonics must be measured one at a time, and requires a variable frequency oscillator which is very stable in amplitude and phase, and therefore expensive.

It is also known to use Fourier Transform techniques to derive the frequency spectrum (frequency domain information) from the time domain signal. However, even a conventional Fast Fourier Transform analysis of a one-second sample of power supply waveform would require several thousand samples, and the concomitant data storage and processing requirements would be prohibitive in either capacity or speed.

According to a first aspect of this invention a method of analysing a periodic waveform, which includes the step of applying a Fourier transformation to derive a measurement of at least one component of said waveform, is characterised by:

deriving samples throughout each of a plurality of cycles of said waveform at a rate which is an integral multiple of the frequency of said waveform;

summing each sample with the corresponding sample derived in each of the other said cycles of said waveform; and applying said Fourier transformation to said summed samples to derive said measurement.

According to a second aspect of this invention there is provided apparatus for analysing a periodic waveform including means arranged to apply a Fourier transformation to derive a measurement of at least one component of said waveform, and characterised by:

means arranged to derive samples throughout each of a plurality of cycles of said waveform at a rate which is an integral multiple of the frequency of said waveform; and means arranged to receive said samples from said sampling means and to sum each sample with the corresponding sample derived in each of the other said cycles of said waveform;

said Fourier transformation means being arranged to operate upon said summed samples to derive said measurement.

According to a third aspect of this invention a method of measuring the harmonic content of a periodic waveform is characterised by:

determining the fundamental frequency of said waveform and generating control signals at an integral multiple of said fundamental frequency;

deriving samples of said waveform in response to said control signals throughout each of a plurality of cycles of said waveform;

summing each sample with the corresponding sample derived in each of the other said cycles of said waveform; and applying a Fourier transformation to said summed samples to provide a measurement of a predetermined number of harmonics in said waveform.

According to a fourth aspect of this invention a harmonic analyser for measuring the harmonic content of a periodic waveform is characterised by:

means arranged to determine the fundamental frequency of said waveform and to generate control signals at an integral multiple of said fundamental frequency;

means arranged to derive samples of said waveform in response to said control signals throughout each of a plurality of cycles of said waveform;

means arranged to receive and sum each sample with the corresponding sample derived in each of the other said cycles of said waveform; and means arranged to apply a Fourier transformation to said summed samples to provide a measurement of a predetermined number of harmonics in said waveform.

A method and apparatus in accordance with this invention for use in analysing the harmonic content of the overall power supply waveform in an electric-power distribution network will now be described, by way of example, with reference to the accompanying drawings, in which:

FIG. 1 is a block schematic circuit diagram of the apparatus; and

FIG. 2 is a timing diagram showing waveforms at various points in the circuit of FIG. 1.

The apparatus to be described, and the method embodied in it, are for use in measuring the amplitude and phase, relative to the fundamental power supply waveform (typically 220 v at 50 Hz), of components at harmonic frequencies of that waveform in an electric-power distribution network.

Referring to FIG. 1, the overall network voltage is applied at an input 10 of the apparatus to a bandpass filter 12 which has a passband centered on 50 Hz. The output of this filter 12 is connected to one input of a comparator 14, the other input of which receives a reference voltage T equal to the average value of the waveform supplied by the filter 12 (this average value may or may not be zero depending on whether the filter 12 shifts the level of the network voltage).

The output of the comparator 14 is connected to clock a D-type bistable circuit 16 and to one input of a NOR-gate 18. The Q output of the circuit 16 is connected to the other input of the NOR-gate 18, while its Q output is fed back to the D input of the circuit 16 (which therefore operates as a divider having a division ratio of 2).

The Q output of the bistable circuit 16 is also coupled to enable a 16-bit counter 20 to count pulses supplied thereto by a 2 MHz pulse generator 22, and the output of the NOR-gate 18 is connected to a reset input of the counter 20.

The ten most significant bits of the counter 20 are coupled via a latch 24 to a 10-bit counter 26 which also receives the 2 MHz pulses from the generator 22. The ten outputs of the counter 26 are connected to a ten-input NOR gate 28, and the output of this gate 28 is coupled, together with the output of a monostable circuit 29 arranged to be triggered by the output of the comparator 14, to an OR gate 30 which controls the load input of the counter 26 and also, via a NOR-gate 31, the latch 24. Another input of the NOR-gate 31 receives a signal from the $\bar{Q}$ output of a monostable circuit 32 which is triggered by the $\bar{Q}$ output of the bistable circuit 16.

The Q output of this bistable circuit 16 is connected to the clock input of a 5-bit counter 34 which can be set to a count of 31 by a manually-operable switch 36, and which is arranged to provide output signals indicative of counts of 1 and 26.

The output for a count of 1 is coupled to set a bistable circuit 38, and the output for a count of 26 is coupled to reset both this bistable circuit 38 and the bistable circuit 16.

The Q output of the bistable circuit 38 is connected to enable a gate 40 to conduct signals from the output of the NOR gate 28 to trigger a sample-and-hold circuit 42 and an analogue-to-digital converter 44. The sample-and-hold circuit 42 receives the network voltage from the input 10 via a notch filter 46 tuned to reject signals at 50 Hz and a low pass filter 48 tuned to attenuate signals above 1500 Hz.

The a-d converter 44 generates a 12-bit digital signal representative of the magnitude of the analogue signal it receives from the sample-and-hold circuit 42, and supplies this digital signal to a digital adder 50. This adder 50 is operative to sum this digital signal with another similar signal supplied to it by a store 52, and then return the result to the store 52.

The store 52 has sixty-four storage locations, each with a capacity of twenty-four bits, and the particular location from which a signal is to be supplied to the adder 50 and in which the resulting sum is to be stored (under the control of signals applied to a R/W input), is identified by a 6-bit signal generated in a counter 54. This counter 54 can be clocked, via an OR gate 56, either by the signals passed by the gate 40 or by signals supplied by a Fourier-Transform analysis circuit 58.

The analysis circuit 58 is arranged to be triggered by the signal indicative of a count of 26 in the counter 34, and to receive and analyse the sixty-four 24-bit digital signals held in the store 52. As indicated in FIG. 1, the analysis of these digital signals could utilise the Fast Fourier Transform (FFT), in which case the analysis circuit 58 would contain a digital representation of a 64×64 term Fourier-Transform matrix (each term being a complex number), or the result of appropriate mathematical manipulation thereof, plus the necessary circuitry for performing the arithmetical operations involved in applying the matrix to the digital signals received from the store 52. Alternatively, the analysis circuit 58 could implement the Fourier Transform in a sequential manner, by correlating the waveform represented by the digital signals in the store 52 with sine waves at the frequencies of the harmonics for which amplitude and phase information is required. In either case, the design and operation of the circuits 50, 52 and 58 is well known, and need not be discussed in detail here.

The results of the analysis performed by the circuit 58, that is the amplitude and phase of the harmonics of the mains frequency, relative to the fundamental at that frequency, are passed to a display device 60 for presentation in whatever manner is desired (for example, by means of a digital display and/or as a printed output).

The operation of the circuit shown in FIG. 1 will now be described, with reference also to FIG. 2 which shows waveforms at various points in the circuit; for clarity, only every fourth sample per cycle of the mains frequency waveform has been shown in FIG. 2: as will be explained, the circuit in fact takes 64 samples per cycle.

The network voltage applied to the input 10 is filtered by the bandpass filter 12 to attentuate the noise and harmonic content of the signal applied to the comparator 14, so as to eliminate the possibility of such noise and harmonics causing unwanted operation of the comparator 14. Each time the filtered signal crosses the value of the reference voltage T (FIG. 2a), the comparator 14 changes state (FIG. 2b).

While the apparatus is not taking a measurement the counter 34 is quiescent at a count of 26, thereby holding the bistable circuit 16 in its reset condition with a logic-low at its Q output. When it is desired to initiate a measurement, the switch 36 is actuated, thereby stepping the counter 34 to a count of thirty-one, and consequently removing the reset signal from the bistable circuit 16.

Thereupon, the positive-going transitions of the output of the comparator 14 clock the bistable circuit 16, which commences producing complementary output signals at 25 Hz (FIGS. 2c and 2d).

While the Q output (FIG. 2c) of the bistable circuit 16 is at a logic-high (that is, for one cycle of the mains frequency waveform), the counter 20 counts the pulses from the generator 22. When the mains frequency is at its nominal value of 50 Hz, the counter counts for periods of 20 milliseconds at a time, the total count then being 40,000 pulses. At the end of such a counting period (defined by the Q output of the bistable circuit 16 going to logic-low), the monostable circuit 32 is triggered by the $\bar{Q}$ output of the circuit 16 going to logic-high (FIG. 2d). The monostable circuit 32 then supplies a brief negative-going pulse from its $\bar{Q}$ output (FIG. 2f) to the NOR gate 31, which in turn enables the latch 24 (FIG. 2h) as long as there is no signal at the output of the OR gate 30. The latch 24 responds by storing the most significant ten digits of the final count in the counter 20, after which the counter 20 is reset to zero by the NOR gate 18 (FIG. 2e) in readiness for another counting period.

Each time the load input of the counter 26 is enabled (as explained below), the count stored in the latch 24 is copied into the counter 26, which then counts down from that number in response to the pulses from the generator 22. When the counter 26 has received that number of pulses, its output becomes equal to zero, and the NOR gate 28 generates an output pulse which is supplied via the OR gate 30 to the load input of the counter 26 to cause it to be reset to the number stored in the latch 24 again. Thus, the NOR gate 28 generates a pulse train (FIG. 2g), the repetition frequency of which is related to the number with which the counter 26 is loaded each time it reaches zero. Each pulse (FIG. 2g) which enables the load input of the counter 26 also disables the NOR gate 31 (FIG. 2h) from passing any pulse from the monostable circuit 32 (FIG. 2f), to ensure that the contents of the latch 24 do not change while the counter 26 is being loaded.

As noted above, the counter 20 has a 16-bit capacity, whereas the counter 26 has only a 10-bit capacity and receives only the ten most significant bits from the counter 20 via the latch 24. However, during the counting down in the counter 26, the least significant of these ten bits is accorded the same weight as the least significant bit in the full 16-bit count in the counter 20. The effect of this is to divide the count in the counter 20 by sixty-four ($2^6$) during the transfer via the latch 24. Thus, the number of pulses counted by the counter 26 between each pulse from the NOR gate 28 will always be one sixty-fourth of the number of pulses counted by the counter 20 during a cycle of the mains frequency waveform, and, even though the mains frequency may vary between 48 and 51 Hz, the NOR gate 28 will supply sixty-four equi-spaced pulses during each cycle of the mains frequency waveform. The monostable circuit 29 supplies an additional pulse to the counter 26 at the start of each mains frequency cycle to maintain this synchronisation between the pulses from the NOR-gate 28 and the mains frequency waveform.

Each time the counter 20 is enabled, the counter 34 is also clocked to advance its count by one. The first time this happens after the switch 36 is actuated, the count in the counter 34 resets from 31 back to 0. Thus, for two cycles of the mains frequency waveform the counters 20 and 26 operate without any action elsewhere in the circuit, to allow the generation of pulses by the NOR-gate 28 to stabilise at the appropriate repetition frequency. At the end of those two cycles, the counter 34 is clocked and advances to a count of 1 (FIG. 2i). This causes the bistable circuit 38 to be set (FIG. 2k), thereby enabling the gate 40 to supply the pulses from the NOR gate 28 to the sample-and-hold circuit 42 and the a-d converter 44 (FIG. 2l).

In response to each pulse, the circuits 42 and 44 respectively sample the input waveform from the terminal 10 and generate a digital indication of its magnitude, the waveform having been first filtered to attenuate the mains frequency component (in the filter 46) and high frequency noise (in the filter 48). At the same time, the pulses clock the counter 54, via the OR gate 56, so that for each successive sample which is digitised by the converter 44, a successive location in the store 52 is addressed by the counter 54. As the digitised samples are supplied to the adder 50 by the converter 44, the adder 50 sends a 'read' signal to the R/W input of the store 52, causing it to supply the contents of the addressed location to the adder 50. After the adder 50 has added the value of the digitised sample to the number received from the store 52, it returns the value of the result to the store 52, together with a 'write' signal at the R/W input, so that the result is stored ready for summing with another sample the next time that location is addressed.

As noted above, the repetition frequency of the pulses which trigger the circuits 42 and 44 and clock the counter 54 is always sixty-four per cycle of the mains frequency waveform. Since there are sixty-four locations in the store 52, each is addressed at substantially the same phase angle in successive cycles of the mains frequency waveform. Referring to FIG. 2a, which only indicates every fourth sample, the fourth sample in the first cycle—designated sample $A_1$, would be stored in the location having the address 000011 (decimal 3). Similarly, the sample $B_1$, would be stored at location address 000111, and so on, through to the last sample in the cycle, $P_1$, which would be stored at location address 111111. At this point the mains frequency waveform would be starting another cycle and the counter 54 would be reset to zero by the next pulse from the gate 40. Thus the fourth sample in this next cycle, $A_2$, would be added to the sample (that is, $A_1$) already stored in location address 000011, and so on for the samples through to $P_2$.

This process continues for each successive cycle of the mains frequency waveform, with the samples A, for example, in each cycle being accumulated in location address 000011, the samples B in location address 000111 and the samples P in location address 111111.

At the end of the fiftieth cycle of the mains frequency waveform, during which the samples including $A_{50}$ through to $P_{50}$ are added to the previously-taken samples, the counter 34 is clocked and advances to a count of 26 (FIG. 2j). Thereupon the bistable circuit 38 is reset, closing the gate 40 (FIGS. 2k and 2l) as is the bistable circuit 16 which is then held reset and can no longer enable the counter 20, nor clock the counter 34.

The store 52 now contains sixty-four numbers representing the accumulation of exactly sixty-four samples from each of fifty successive cycles of the mains frequency waveform, as if these cycles had been accurately superimposed on one another. The resultant 'average' waveform represented by these numbers has an amplitude fifty times that of any one cycle of the mains frequency waveform, and a signal-to-noise ratio some seven times better.

When the counter 34 attains a count of 26, it also triggers the analysis circuit 58, which then commences clocking the counter 54 via the OR-gate 56, while applying a 'read' signal to the R/W input of the store 52, so as to extract the numbers stored therein. Depending on the manner of operation of the circuit 58, the contents of the store 52 may be read out repeatedly in the course of the analysis.

When the analysis performed by the circuit 58 is complete, the results are transferred to the display device 60 for presentation of each harmonic's amplitude and phase angle in terms of, for example, decibels and degrees relative to the mains frequency waveform. In this respect, the operations performed by the analysis circuit 58 may include compensation for unavoidable attenuation by the notch filter 46 of the lower-order harmonics.

In addition to reducing the effect of noise (including quantisation noise introduced by the a-d converter 44), the technique described above of averaging successive cycles of the network voltage waveform also provides a reduction in processing by the analysis circuit 58, by reducing the number of samples involved in that processing (but without any consequent loss of accuracy).

The number n of samples per cycle of the network voltage waveform will depend primarily on the number N of the highest-order harmonic to be derived by the analysis circuit 58, according to the well-known relation $n \geq 2 N$ (N=1 being the fundamental). If n is chosen to be integral power of 2, the simple division technique described above in relation to the counters 20 and 26 can be used. Thus, to obtain the amplitude and phase, for example, of the first twenty harmonics (100 Hz to 1050 Hz), a minimum of forty-two samples per cycle would be required, and in this case a figure of sixty-four would be selected, as described above. This in turn would require that the analysis circuit 58, using the FFT, would use a 64×64 Fourier matrix. However, only the first twenty-one rows of this matrix would actually have to be applied in deriving the amplitudes and phases of the desired harmonics, thus permitting a further saving in computation.

Although the apparatus has been shown and described in terms of individual circuit functions, many of these functions (such as those of the counter 34, the adder 50, the store 52, the counter 54 and the analysis circuit 58) could be implemented with a suitably programmed microprocessor. The counters 20 and 26 and their associated circuitry, which generate the sampling trigger pulses at an integral multiple of, and in synchronism with, the mains supply frequency, could be replaced by a phase-locked loop locked to the mains supply waveform and running at a frequency (in this case) 64 times the mains supply frequency.

I claim:

1. A method of analysing a periodic waveform comprising the steps of:

deriving samples throughout each of a plurality of cycles of said waveform at a rate which is an integral multiple of the frequency of said waveform;

summing each sample with corresponding samples derived in each of the other of said plurality of cycles of said waveform;

and applying a Fourier transformation to said summed samples to derive a measurement of at least one characteristic of said waveform.

2. Apparatus for analysing a periodic waveform comprising:

means arranged to derive samples throughout each of a plurality of cycles of said waveform at a rate which is an integral multiple of the frequency of said waveform;

means arranged to receive said samples from said sampling means and to sum each sample with corresponding samples derived in each of the other of said plurality of cycles of said waveform; and Fourier transformation means arranged to operate upon said summed samples to derive a measurement of at least one characteristic of said waveform.

3. A method of measuring the harmonic content of a periodic waveform, comprising the steps of:

determining the fundamental frequency of said waveform and generating control signals at an integral multiple of said fundamental frequency;

deriving samples of said waveform in response to said control signals throughout each of a plurality of cycles of said waveform;

summing each sample with corresponding samples derived in each of the other of said plurality of cycles of said waveform;

and applying a Fourier transformation to said summed samples to provide a measurement of at least one characteristic of a predetermined number of harmonics in said waveform.

4. A harmonic analyser for measuring the harmonic content of a periodic waveform comprising:

means arranged to determine the fundamental frequency of said waveform and to generate control signals at an integral multiple of said fumdamental frequency;

means arranged to derive samples of said waveform in response to said control signals throughout each of a plurality of cycles of said waveform;

means arranged to receive and sum each sample with corresponding samples derived in each of the other of said plurality of cycles of said waveform;

and means arranged to apply a Fourier transformation to said summed samples to provide a measurement of at least one characteristic of a predetermined number of harmonics in said waveform.

* * * * *